US009196747B2

(12) United States Patent
    Choi

(10) Patent No.: US 9,196,747 B2
(45) Date of Patent: Nov. 24, 2015

(54) LIGHT EMITTING DISPLAY AND THIN FILM TRANSISTOR (TFT)

(75) Inventor: Woong-Sik Choi, Gyeonggi-do (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 1889 days.

(21) Appl. No.: 11/448,684

(22) Filed: Jun. 8, 2006

(65) Prior Publication Data

US 2006/0290633 A1 Dec. 28, 2006

(30) Foreign Application Priority Data

Jun. 22, 2005 (KR) .................................. 2005-53975

(51) Int. Cl.
    *G09G 3/36* (2006.01)
    *H01L 29/786* (2006.01)
    *H01L 27/12* (2006.01)
    *H01L 27/32* (2006.01)

(52) U.S. Cl.
    CPC .......... *H01L 29/78696* (2013.01); *H01L 27/12* (2013.01); *H01L 29/78645* (2013.01); *H01L 27/1214* (2013.01); *H01L 27/3244* (2013.01)

(58) Field of Classification Search
    CPC .................... H01L 29/78696; H01L 29/78645
    USPC .............. 345/76–77, 82–84, 92, 204, 7, 928; 315/169.3
    See application file for complete search history.

(56) References Cited

U.S. PATENT DOCUMENTS

| 6,229,506 B1 * | 5/2001 | Dawson et al. .................. 345/82 |
| 6,512,269 B1 | 1/2003 | Bryant et al. |
| 6,937,215 B2 * | 8/2005 | Lo .................................... 345/82 |
| 7,310,078 B2 * | 12/2007 | Kim ................................. 345/76 |
| 7,414,599 B2 * | 8/2008 | Chung et al. .................... 345/76 |
| 7,508,365 B2 * | 3/2009 | Kim ................................. 345/76 |

(Continued)

FOREIGN PATENT DOCUMENTS

| CN | 1420386 A | 5/2003 |
| CN | 1477910 | 2/2004 |

(Continued)

OTHER PUBLICATIONS

European Search Report issued by the European Patent Office on Oct. 11, 2006.

(Continued)

*Primary Examiner* — Matthew Fry
(74) *Attorney, Agent, or Firm* — Robert E. Bushnell, Esq.

(57) ABSTRACT

A light emitting display for improving image quality and a Thin Film Transistor (TFT) includes at least one data line for transmitting a data signal, at least one scanning line for transmitting a selected signal, and at least one pixel electrically connected to the data line and the scanning line. The pixel includes a first TFT for responding to the selected signal and transmitting the data signal to an organic light emitting device, a capacitor electrically connected to the first TFT and storing a voltage corresponding to the transmitted data signal, a second TFT connected to the capacitor and supplying an organic light emitting device with a current corresponding to the data signal selected by the selected signal. The widths of respective channel regions of the first TFT are different from each other to reduce the kickoff voltage and improve the driving ability of the TFT, thereby improving the image quality of the light emitting display.

5 Claims, 4 Drawing Sheets

(56) References Cited

U.S. PATENT DOCUMENTS

| | | | |
|---|---|---|---|
| 2003/0030381 A1* | 2/2003 | Yamazaki et al. | 315/169.1 |
| 2004/0079944 A1 | 4/2004 | Hiroshima et al. | |
| 2004/0142502 A1 | 7/2004 | Yoo et al. | |
| 2005/0017934 A1* | 1/2005 | Chung et al. | 345/82 |
| 2005/0156514 A1* | 7/2005 | Park | 313/504 |
| 2005/0200618 A1* | 9/2005 | Kim et al. | 345/204 |
| 2005/0219166 A1* | 10/2005 | Kim | 345/76 |
| 2006/0038754 A1* | 2/2006 | Kim | 345/76 |
| 2006/0066253 A1* | 3/2006 | Kim | 315/169.3 |
| 2006/0071884 A1* | 4/2006 | Kim | 345/76 |
| 2006/0114193 A1* | 6/2006 | Kwak et al. | 345/76 |
| 2006/0256057 A1* | 11/2006 | Han et al. | 345/92 |

FOREIGN PATENT DOCUMENTS

| | | |
|---|---|---|
| CN | 1497522 | 5/2004 |
| CN | 1536681 | 10/2004 |
| JP | 2003-241688 | 8/2003 |
| JP | 2004-340981 | 12/2004 |
| JP | 2004340981 A * | 12/2004 |
| JP | 2005-031630 | 2/2005 |
| JP | 2005-157244 | 6/2005 |
| KR | 10-2005-0067803 | 7/2005 |
| WO | WO03/081676 | 10/2003 |
| WO | WO 03/081676 | 10/2003 |

OTHER PUBLICATIONS

European Search Report corresponding to European Patent Application No. 06115852.3-1528, issued on Feb. 27, 2007.
Office Action from the SIPO issued in Applicant's corresponding Chinese Patent Application No. 200610090032.0 dated Apr. 4, 2008.
Office action from Japanese Patent Office issued in Applicant's corresponding Japanese Patent Application No. 2006-111114 dated Apr. 20, 2009 and Request for Entry of the Accompanying Office Action.
Office action from State Intellectual Property Office of P.R. China issued in Applicant's corresponding Chinese Patent Application No. 200610090032.0 dated Mar. 20, 2009 and its English translation.
Chinese Office Action issued by Chinese Patent Office on Apr. 26, 2010 corresponding Chinese Patent Application No. 200610090032.0 and English translation attached.

* cited by examiner

LIGHT EMITTING DISPLAY AND THIN FILM TRANSISTOR (TFT)

CLAIM OF PRIORITY

This application makes reference to, incorporates the same herein, and claims all benefits accruing under 35 U.S.C. §119 from an application for LIGHT EMISSION DISPLAY AND THIN FILM TRANSISTOR earlier filed in the Korean Intellectual Property Office on 22 Jun. 2005 and there duly assigned Serial No. 10-2005-53975.

BACKGROUND OF THE INVENTION

1. Field of the Invention

The present invention relates to a light emitting display and a Thin Film Transistor (TFT), and more particularly, to a TFT having improved driving ability by reducing off-current and a light emitting display having enhanced image quality using the TFT.

2. Description of the Related Art

Generally, an active matrix type light emitting display includes at least a single data line for transmitting data signal, at least a single scanning line for transmitting a selecting signal, and a plurality of image pixels electrically connected to the data line and the scanning line. Generally, each image pixel includes a light emitting device, a capacitor for storing voltage corresponding to the data signal transmitted from the data line, and at least two Thin Film Transistors (TFTs) for controlling the light emitting device. As described above, the structure of the image pixel including two TFTs and a single capacitor is '2TR+1Cap' structure.

In the 2TR+1Cap structure, one of the two TFTs serves to as a switching device for responding the selecting signal and transmitting the data signal to the light emitting device, and the other serves to as a driving device for supplying electric current to corresponding to the selected data signal to the light emitting device. The TFTs are manufactured to have a semiconductor layer, a gate insulating layer, a gate electrode, and source/drain electrodes laminated in turn, and are generally divided into a staggered type TFT and a coplanar type TFT. Moreover, according to the formation position of the gate electrode with respect to the source/drain electrodes, the TFTs are divided into an upper gate structured TFT and a lower gate structured TFT.

For example, the upper gate structured TFT includes a semiconductor layer formed on a substrate, a gate insulating layer formed on the semiconductor layer, a gate electrode formed on the gate insulating layer, and source/drain electrodes. The semiconductor layer includes source and drain regions doped with impurities of a predetermined concentration, and a channel region formed between the source and drain regions. The gate electrode is generally formed on the gate insulating layer on the channel region, and the source/drain electrodes are respectively connected to the source and drain regions through contact holes while interposing interlayer-insulating layer on the gate electrode.

In the light emitting display including the image pixels having the two TFTs and the capacitor, when leakage current of the switching TFT turning on/off a driving TFT is large, the capacitor cannot maintain data voltage uniform. Thus, in the light emitting display, crosstalk, flicker, and so on are caused, and further image quality of the light emitting display may be deteriorated.

In order to overcome the above-mentioned problems and improve the image quality of the light emitting display including the image pixels having the 2TR+1Cap structure, addition of complementing circuits to the image pixels is proposed.

However, since, when the complementation circuits are added to the image pixel structure, a plurality of TFTs must be added, driving method thereof becomes relatively complex in comparison to the conventional image pixel structure. Moreover, since, in the image pixel structure including the complementation circuit, there is a high possibility of leakage current through the path from the capacitor to the plural TFTs, the ability of the capacitor for maintaining voltage is relatively deteriorated. In other words, although the complementation circuit is added to the image pixel structure, the image quality of the light emitting display may be deteriorated.

Additionally, terminals of every device constituting the image pixel are affected by kickback voltage generated by the peak-to-peak of a gate signal used in a single image pixel, that is, the voltage difference raging from EL VDD to EL VSS. Moreover, when the kickback voltage, generated by a terminal to which the capacitor is connected, is increased, voltage for driving the light emitting devices is affected so that the image quality is deteriorated.

SUMMARY OF THE INVENTION

Therefore, the present invention has been made to overcome the above-mentioned problems, and it is an object of the present invention to provide a Thin Film Transistor (TFT) in which widths of end sides of channel regions of switching TFTs constituting an image pixel are different from each other so that off-current is decreased and driving ability is improved, and a light emitting display having improved image quality.

In accordance with the present invention, the above and other objects can be accomplished by the provision of a light emitting display including: at least one data line adapted to transmit a data signal; at least one scanning line adapted to transmit a selected signal; at least one pixel electrically connected to the data line and the scanning line, the pixel including: a first TFT adapted to respond to the selected signal and to transmit the data signal to an organic light emitting device, and a capacitor electrically connected to the first TFT and adapted to store a voltage corresponding to the transmitted data signal; and a second TFT connected to the capacitor and adapted to supply the organic light emitting device with a current corresponding to the data signal selected by the selected signal; respective widths of channel regions of the first TFT are different from each other.

One end of a channel region having a smallest width among the widths of the channel regions of the first TFT is preferably electrically connected to one electrode of the capacitor.

One end of a channel region having a smallest width among the widths of ends of the channel regions of the first TFT is preferably electrically connected to a gate electrode of the second TFT.

One end of a channel region having a smallest width among the widths of ends of the channel regions of the first TFT preferably includes a drain electrode of the first TFT.

The first TFT preferably includes a dual gate structure. The first TFT preferably includes a dual gate structure.

The pixel preferably further includes a threshold voltage compensation circuit adapted to compensate a threshold voltage of the second TFT. The pixel preferably further includes a voltage drop compensation circuit adapted to compensate a voltage drop of a first voltage supplied to the pixel.

The first TFT preferably includes a structure selected from a group of structures including a coplanar structure, a staggered structure, an upper gate structure, and a lower gate structure.

In accordance with the present invention, the above and other objects can be accomplished by the provision of a TFT including: a semiconductor layer including a channel region having a width of one end thereof greater than a width of another end thereof and having source and drain regions arranged in the ends of the channel region; source and drain electrodes electrically connected to the semiconductor layer; an insulating layer contacting the channel region; and a gate electrode facing the channel region and having the insulating layer interposed therebetween.

The another end of the channel region is preferably electrically connected to the drain region.

The TFT preferably further includes a dual gate structure, the channel region and the gate electrode respectively preferably including first and second channel regions and first and second gate electrodes.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Hereinafter, exemplary embodiments according to the present invention are described below with reference to the accompanying drawings.

Figure 1:
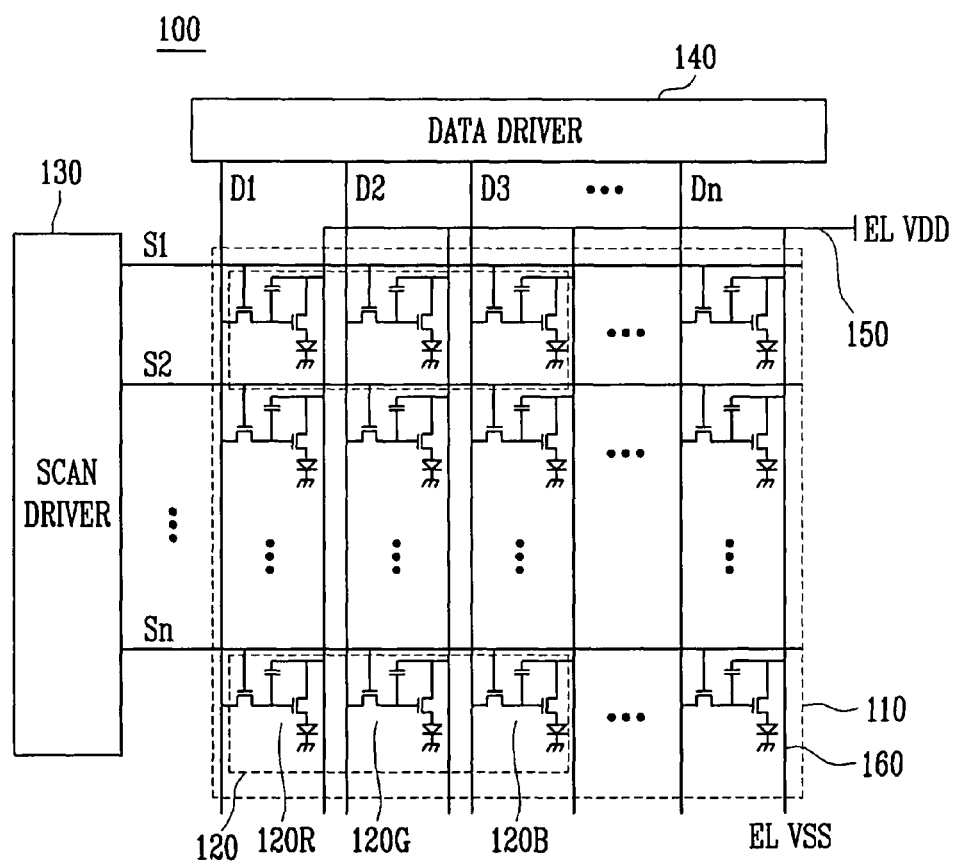
FIG. 1 is a circuit diagram of a light emitting display according to an embodiment of the present invention.
Figure 2:
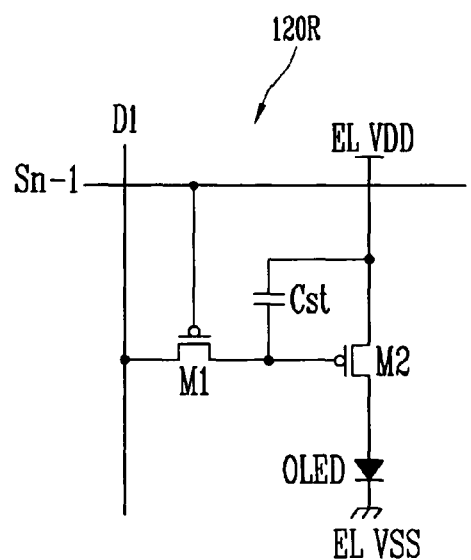
FIG. 2 is a partially enlarged view of the light emitting display of FIG. 1.

FIG. 1 is a circuit diagram of a light emitting display according to an embodiment of the present invention, and FIG. 2 is a partially enlarged view of the light emitting display of FIG. 1.

As shown in FIG. 1, a light emitting display 100 includes an image display 110 having a plurality of image pixels 120, a scan driver 130 for transmitting a selected signal to the image display 110 through a plurality of scanning lines S1, S2, to Sn, and a data driver 140 for transmitting a data signal to the image display 110 through a plurality of data lines D1, D2, D3, to Dm.

The image display 110 includes a plurality of image pixels having sub-image pixels 120R, 120G, and 120B for displaying Red (R), Green (G), and Blue (B). Each of the image pixels 120 is connected to the scanning lines S1 to Sn to which the selected signal such as the scanning signal are transmitted, the data lines D1 to Dm for transmitting the data signal, a first power line 150 for supplying a first voltage EL VDD, and a second power line 160 for supplying a second voltage EL VSS.

As shown in FIG. 2, the sub-image pixel 120R of the image pixel 120 includes an organic light emitting device (OLED), a first Thin Film Transistor (TFT) M1, a capacitor Cst, and a second TFT M2. Moreover, a scanning line Sn−1 connected to one of the first TFT M1, the capacitor Cst, and the second TFT M2, the data line D1, and the first power line EL VDD are connected to the sub-image pixel 120R. The scanning line Sn−1 is formed in the row direction, and the data line D1 and the power line EL VDD are formed in the column direction. The first TFT M1 serves as a switching device for responding to the selected signal and transmitting the data signal to the OLED, and the second TFT M2 serves as a driving device for supplying an electrical current corresponding to the data signal selected by the selected signal to the OLED.

The above-mentioned sub-image pixel 120R displays an image according to the following driving principle. When the scanning signal is supplied to a gate electrode of the first TFT M1, the first TFT M1 is turned on. When the first TFT M1 is turned on, the capacitor Cst is charged by a voltage corresponding to the data signal and the voltage of the capacitor Cst is supplied to the gate electrode of the second TFT M2. By doing so, the second TFT M2 supplies an electrical current to OLED such that every OLED contained in each of sub-image pixel 120a is lit.

Figure 3:
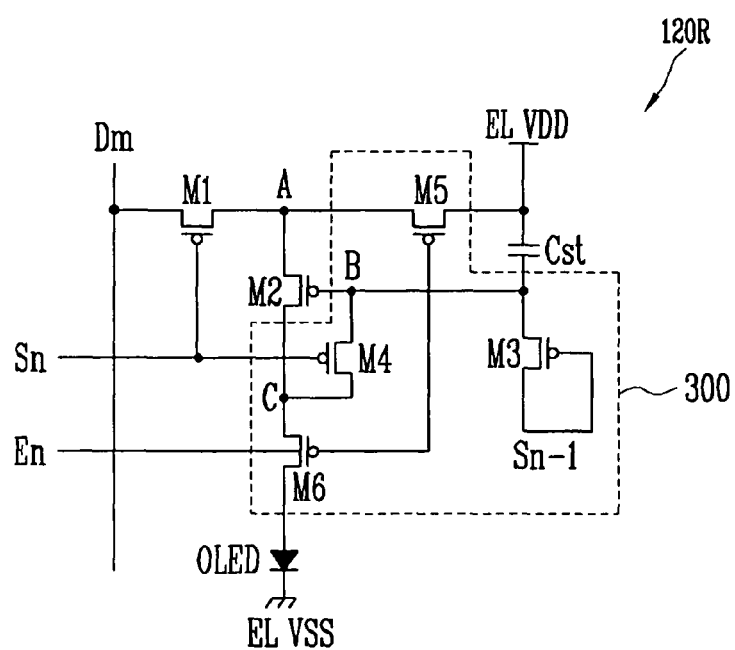
FIG. 3 is a circuit diagram of a light emitting display according to another embodiment of the present invention.

FIG. 3 is a circuit diagram of a light emitting display according to another embodiment of the present invention. As shown in FIG. 3, the electric circuit in FIG. 3 includes a threshold voltage compensating circuit for compensating the threshold voltage to the 2TR+1Cap structure of the circuit of FIG. 2.

The sub-image pixel 120R of FIG. 3 includes an organic light emitting device OLED, the first TFT M1 serving as a switching device, the second TFT M2 serving as a driving device, the capacitor Cst, and the threshold compensating circuit 300. The threshold compensating circuit 300 includes a third TFT M3, a fourth TFT M4, a fifth TFT M5, and a sixth TFT M6.

The first to sixth TFTs M1, M2, M3, M4, M5, and M6 respectively include gate electrodes, source electrodes, and drain electrodes, and the capacitor Cst includes a first electrode and a second electrode.

The gate electrode of the first TFT M1 is connected to nth scanning line Sn, the source electrode of the first TFT M1 is connected to the data line Dm, and the drain electrode of the first TFT M1 is connected to a first node A. The data signal is transmitted to the first node A in response to an nth scanning signal inputted through the scanning line Sn.

The source electrode of the second TFT M2 is connected to the first node A, the drain electrode of the second TFT M2 is connected to a third node C, and a gate electrode of the second TFT M2 is connected to a second node B. When the electrical potential of the second node B is equal to the electrical potential of the third node C by the fourth TFT M4, the second TFT M2 serves as a diode, so that the data signal transmitted to the first node A reaches the second node B via the second TFT M2. When electrical power for the image pixel is supplied to the first node A through the image power line EL VDD, an electrical current corresponding to the voltage supplied to the gate electrode flows from the source electrode to the drain electrode. In other words, a current flow due to the electrical potential of the second node B is determined.

A gate electrode of the third TFT M3 is connected the n−1th scanning line Sn−1 and a drain electrode of the third TFT M3 is connected to the second node B. The nth scanning signal inputted through the n−1th scanning line Sn−1 is transmitted to the second node B.

A gate electrode of the fourth TFT M4 is connected to the nth scanning line Sn, a source electrode of the fourth TFT M4 is connected to the third node C, and a drain electrode of the fourth TFT M4 is connected to the second node B. The electrical potential of the second node B is identical to the electric potential of the third node C in response to the nth scanning signal inputted through the nth scanning line Sn.

A source electrode of the fifth TFT M5 is connected to the image pixel power line EL VDD, a drain electrode of the fifth TFT M5 is connected to the first node A, and a gate electrode of the fifth TFT M5 is connected to a light emitting controlling line En. The image pixel electrical power is selectively transmitted to the second TFT M2 in response to a light emitting controlling signal transmitted through the light emitting controlling line En.

A source electrode of the sixth TFT M6 is connected to the third node C, a drain electrode of the sixth TFT M6 is connected to the organic light emitting device OLED, and a gate electrode of the sixth TFT M6 is connected to the light emitting controlling line En. Electrical current is selectively transmitted to the organic light emitting device OELD in response to the light emitting controlling signal transmitted through the light emitting controlling line En.

A first electrode of the capacitor Cst is connected to the image pixel power line EL VDD and a second electrode of the capacitor Cst is connected to the second node B. When an initial signal is supplied to the second node B by the third TFT M3, the initial signal is transmitted to the capacitor Cst, and the capacitor Cst receiving the initial signal stores the initial voltage and charges to a voltage corresponding to the data signal when the data signal is transmitted to the second TFT M2 by the first TFT M1 and the forth TFT M4. The capacitor Cst transmits the stored voltage to the second node B such that the voltage stored in the capacitor Cst is supplied to the gate electrode of the second TFT M2.

Hereinafter, elements of the sub-image pixel 120R are described in detail below with reference to FIG. 4, a schematic side sectional view of the circuit of the light emitting display of FIG. 2.

Figure 4:
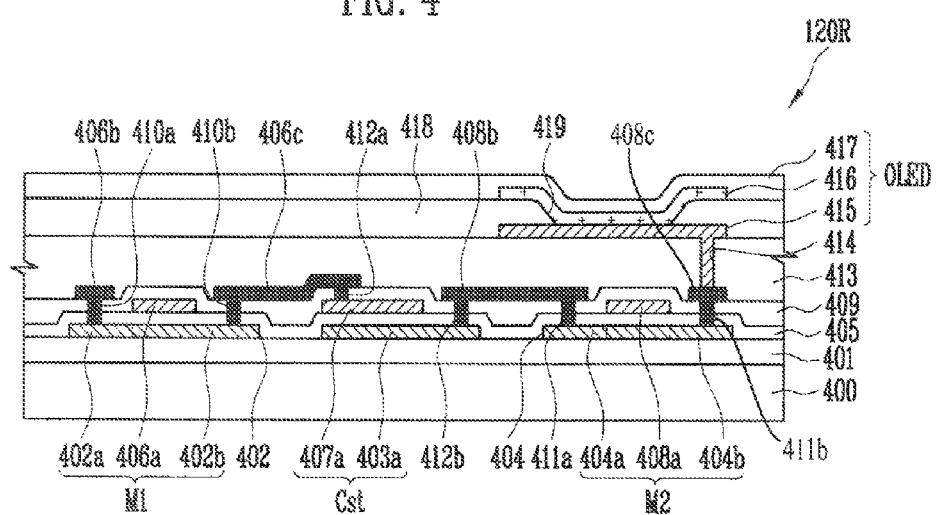
FIG. 4 is a schematic side sectional view of the light emitting display of FIG. 2.

As shown in FIG. 4, the sectional structure of the sub-image pixel 120R includes a buffer layer 401 formed on an insulating substrate 400 such as glass in a form of a nitride film or an oxide film. The buffer layer 401 prevents impurities such as metal ions from spreading into an active channel in the semiconductor layer.

An amorphous silicon layer is then formed by a process, such as Chemical Vapor Deposition (CVD), sputtering, or the like, on the substrate 400 formed with the buffer layer 401. The amorphous silicon layer is formed of semiconductor layers 402 and 404 by solid phase crystallization, such as SPC, MIC, SGS, or the like, and liquid phase recrystallization, such as ELA. Simultaneously, a lower electrode 403a of the capacitor Cst is formed. The semiconductor layers 402 and 404 can be formed such that the amorphous silicon layer is laminated on the substrate and crystallized into a polysilicon layer, or the polysilicon layer is directly laminated on the buffer layer 401 and is processed by patterning.

The semiconductor layers 402 and 404 can be patterned in a predetermined shape in order to provide transfer characteristics different from that of the second TFT M2 serving as a driving device to the first TFT M1 serving as a switching device in the present invention. The light emitting ability of the organic light emitting device OLED exhibits a brightness difference according to the current supplied to the organic light emitting device OELD. In other words, an organic light emitting device with excellent light emitting ability can exhibit a brightness higher than those of other organic light emitting devices when equal currents are supplied thereto. The detailed shape of the patterned semiconductor layer 402, for improving the light emitting efficiency of the organic light emitting device OELD, is described later with reference to FIGS. 5 and 6.

A gate insulating layer 405 is formed on the semiconductor layers 402 and 404, and gate electrodes 406a and 408a are formed on the gate insulating layer 405. An upper electrode 407a of the capacitor Cst is formed together with the gate electrodes 406a and 408a. Next, impurities are doped using the gate electrodes 406a and 408a as masks to form source and drain regions 402a, 402b, 404a, and 404b. The semiconductor layers 402 and 404 located at the lower side of the gate electrodes 406a and 408a become the channel regions, and doping regions formed in the lateral sides of the channel regions become respectively the source regions 402a and 404a and the drain regions 402b and 404b.

An interlayer insulating film 409 is formed on the upper side of the above-mentioned structure, and first and second contact holes 410a, 411a, 410b and 411b are formed on the interlayer insulating film 409. The first and second contact holes 410a, 411a, 410b, and 411b respectively expose the source regions 402a and 404a and the drain regions 402b and 404b of the first TFT M1 and the second TFT M2. Third contact holes 412a and 412b for exposing the upper electrode 407a of the capacitor Cst can be formed together with the first and second contact holes 410a, 411a, 410b, and 411b. Source electrodes 406b and 408b and drain electrodes 406c and 408c, respectively connected to the source regions 402a and 404a and the drain regions 404a and 404b via the first and second contact holes 410a, 411a, 410b, and 411b, are formed on the interlayer insulating layer.

A protection layer 413 is formed on the interlayer insulating film 409. A fourth contact hole 414 for exposing the drain electrode 408c of the second TFT M2 is formed in the protection layer 413 and interlayer insulating film 409. A first electrode 415 (hereinafter referred to as an anode electrode) of the organic light emitting device OELD is formed on the protection layer 413. The anode electrode 415 is electrically connected to the drain electrode 408c of the second TFT M2 via the fourth contact hole 414. A pixel definition layer 418 is formed on the anode electrode 415, and an opening 419 for exposing the anode electrode 415 is formed in the pixel definition layer 418. A light emitting layer 416 is formed in the opening 419. A second electrode 417 (cathode electrode) of the organic light emitting device OELD is formed on the light emitting layer 416.

Through the above-mentioned laminating order, the first TFT M1, including the source electrode 406b connected to the source region 402a of the semiconductor layer 402, the drain electrode 406c connected to the drain region 402b, and the gate electrode 406a formed on the semiconductor layer 402, is formed. Moreover, the second TFT M2, including the source electrode 408b connected to the source region 404a of the semiconductor layer 404, the drain electrode 408c connected to the drain region 404b, and the gate electrode 408a formed on the semiconductor layer 404, is formed. The capacitor Cst comprises the lower electrode 403a and the upper electrode 407a. The organic light emitting device OELD comprises the anode electrode 415, the light emitting layer 416, and the cathode electrode 417.

In this embodiment, although the method of manufacturing image pixels including PMOS-structured TFTs has been described, the present invention is not limited to this and can be easily applied to methods of manufacturing image pixels including other TFTs such as NMOS- or CMOS-structured TFTs. Although, with respect to FIG. 4, the sectional structure of the image pixels including the upper gate type or coplanar type first TFT M1 served to as a switching device has been described, such sectional structure can be applied almost like the sectional structures of the other sub-image pixels 120G and 120B. Moreover, although this embodiment of the present invention discloses the side sectional view of the light emitting display in FIG. 2 illustrating the circuit diagram of the 2TR+1Cap structure, a side sectional view of the light emitting display can be described with reference to FIG. 4 including a threshold voltage compensation circuit.

Hereinafter, the pattern of the first TFT M1 serving as a switching device is described in detail with reference to FIGS. 5 and 6, which are plan views illustrating the TFT of the light emitting display according to an embodiment of the present invention.

Figure 5:
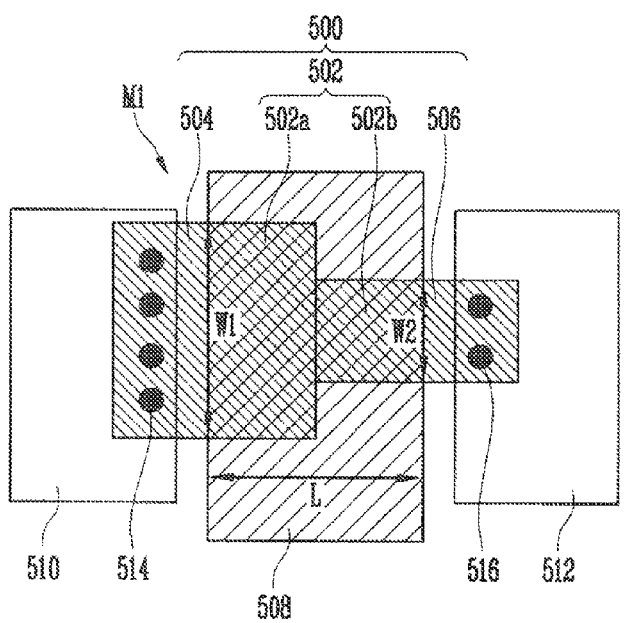
FIG. 5 is a plan view of a Thin Film Transistor (TFT) according to a first embodiment of the present invention.

As shown in FIG. 5, the channel region of the first TFT M1 has a first width W1 and a second width W2, and the length L. An end having a smaller width W2 of the widths W1 and W2 of the channel region of the first TFT M1 is electrically connected to one of electrodes of the capacitor Cst and the gate electrode of the second TFT M2, and the end having the smaller width W2 of the channel region is the drain electrode of the first TFT M1.

In detail, the first TFT M1 includes a semiconductor layer 500, a gate electrode 508, a source electrode 510, and a drain electrode 512. The semiconductor layer 500 includes channel regions 502 (502a and 502b) formed in the lower side of the gate electrode 508, and source region 504 and drain region 506, formed at the lateral sides of the channel regions 502. The source electrode 510 is electrically connected to the source region 504 via at least a single first contact hole 514, and the drain electrode 512 is electrically connected to the drain region 506 via at least a single second contact hole 516.

Figure 6:
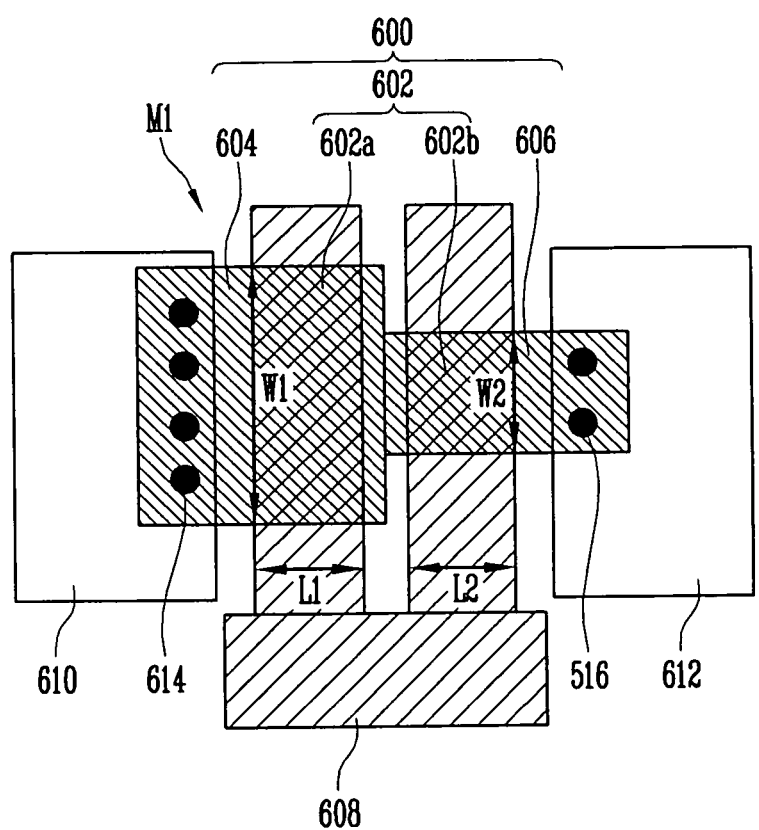
FIG. 6 is a plan view of a TFT according to a second embodiment of the present invention.

As shown in FIG. 6, the channel region of the first TFT M1 has a first width W1 and a second width W2. In this embodiment of the present invention, the first TFT M1 has a dual gate structure L1 and L2. In the dual gate structured first TFT M1, an end having a smaller width W2 of the widths W1 and W2 of the channel region is electrically connected to one of electrodes of the capacitor Cst and the gate electrode of the second TFT M2, and the end having the width W2 is the drain electrode of the first TFT M1.

In detail, the first TFT M1 in FIG. 6 includes a semiconductor layer 600, a gate electrode 608, a source electrode 610, and a drain electrode 612. The semiconductor layer 600 includes channel regions 602 (602a and 602b) formed in the lower side of the gate electrode 608, and a source region 604 and a drain region 606 formed in the lateral sides of the channel regions 602. The source electrode 610 is electrically connected to the source region 604 via at least a single first contact hole 614, and the drain electrode 612 is electrically connected to the drain region 606 via at least a single second contact hole 616.

As shown in FIGS. 5 and 6, respective the widths W1 and W2 of the channel regions 502 and 602 of the first TFT M1 have multiple steps. As such, the widths of the ends of the channel regions 502 and 602 of the first TFT M1 are different from each other so that off-current can be reduced and kickback voltage can be also reduced. Generally, since the kickback voltage is affected by the overlapped area between the channel regions 502 and 602 and the gate electrodes 508 and 608 with respect to the central region of the channel regions 502 and 602, the kickback voltage can be reduced by decreasing the width of a channel region contacting a terminal causing the kickback phenomenon.

Particularly, the kickback voltage can be reduced by decreasing the width of the channel region connected to the gate of the second TFT M2 serving as a driving device. When the TFT serving as a switching device is so structured, the kickback voltage and the off-current can be reduced even in the pixel structure including the compensation circuit in which a relatively high leakage current is generated by a plurality of TFT paths.

Although the above-described embodiment is applied to the pixel structure (2TR+1Cap) including two TFTs and a single capacitor and a pixel structure further including the threshold voltage compensation circuit for compensating threshold voltage of the second TFT having the 2TR+1Cap structure, the present invention is not limited to these, but can be applied to a pixel structure further including a voltage drop compensation circuit for compensating for the voltage drop of a first electrical power and other various pixel image structures. Moreover, although, in the above-mentioned embodiment, the length of the first channel region of the channel regions is equal to the length of the second channel region, the length of the first channel region can be different from the length of the second channel region.

As described above, according to the present invention, the widths of ends of the channel regions of the TFT are different from each other so that the kickback voltage and the off-current of the TFT can be reduced. Therefore, the image quality of the light emitting display adopting the above-mentioned TFT can be improved.

Although exemplary embodiments of the present invention have been shown and described, it would be appreciated by those skilled in the art that modifications can be made to these embodiments without departing from the principles and spirit of the present invention, the scope of which is defined by the following claims.

What is claimed is:

1. A light emitting display, comprising:
   at least one data line adapted to transmit a data signal;
   at least one scanning line adapted to transmit a selected signal;
   at least one pixel electrically connected to the data line and the scanning line, the pixel comprising:
      a first Thin Film Transistor (TFT) adapted to respond to the selected signal and to transmit the data signal to an organic light emitting diode;
      a capacitor electrically connected to the first TFT and adapted to store a voltage corresponding to the transmitted data signal;
      a second Thin Film Transistor (TFT) connected to the capacitor and adapted to supply the organic light emitting diode with a current corresponding to the data signal selected by the selected signal;
      the first TFT having a semiconductor layer forming a channel region, a drain region and a source region, the channel region having first and second widths the second width being smaller than the first width, the source region having the first width and the drain region having the second width, the first TFT having transfer characteristics different from the second TFT; and
   a threshold voltage compensation circuit compensating a threshold voltage of the second TFT, the threshold voltage compensation circuit selectively transmitting an electrical current to the organic light emitting diode in response to a light emitting controlling signal transmitted through a light emitting controlling line, the threshold voltage compensation circuit comprising:
a third Thin Film Transistor (TFT), responsive to a scanning line signal, having a drain electrode connected to a first electrode of the capacitor and to a gate electrode of the second TFT, a source electrode of the third TFT being connected to a gate electrode of the third TFT;
a fourth Thin Film Transistor (TFT), adapted to respond to the selected signal, having a drain electrode connected to the gate electrode of the second TFT, a source electrode of the fourth TFT being connected to a drain electrode of the second TFT, and a gate electrode receiving the selected signal, the gate electrode of the fourth TFT being connected to a gate electrode of the first TFT;
a fifth Thin Film Transistor (TFT) having a drain electrode connected to a drain electrode of the first TFT, a source electrode connected to a second electrode of the capacitor and a first power line, and a gate electrode connected to the light emitting controlling line; and
a sixth Thin Film Transistor (TFT) having a source electrode connected to the drain electrode of the second TFT, a drain electrode connected to an anode of the organic light emitting diode, and a gate electrode connected to the light emitting controlling line.

2. The light emitting display according to claim 1, the first TFT further comprising a dual gate electrode structure.

3. The light emitting display according to claim 1, the first TFT further comprising a structure selected from a group of structures including a coplanar structure, a staggered structure, an upper gate structure, and a lower gate structure.

4. The light emitting display according to claim 1, the first Thin Film Transistor (TFT) comprising:
an insulating layer contacting the semiconductor layer;
source and drain electrodes electrically connected to the semiconductor layer through the insulating layer, and the drain electrode electrically connecting the drain region to a gate electrode of the second TFT; and
a gate electrode formed on the insulating layer opposite the channel region.

5. The light emitting display as claimed in claim 4, the gate electrode of the first TFT comprising a dual gate structure having first and second gate electrodes.

* * * * *